(12) United States Patent
Solihin

(10) Patent No.: US 10,176,107 B2
(45) Date of Patent: Jan. 8, 2019

(54) METHODS AND SYSTEMS FOR DYNAMIC DRAM CACHE SIZING

(71) Applicant: EMPIRE TECHNOLOGY DEVELOPMENT LLC, Wilmington, DE (US)

(72) Inventor: Yan Solihin, Raleigh, NC (US)

(73) Assignee: Empire Technology Development LLC, Wilmington, DE (US)

( * ) Notice: Subject to any disclaimer, the term of this patent is extended or adjusted under 35 U.S.C. 154(b) by 72 days.

(21) Appl. No.: 15/300,272

(22) PCT Filed: Mar. 29, 2014

(86) PCT No.: PCT/US2014/032285
§ 371 (c)(1),
(2) Date: Sep. 28, 2016

(87) PCT Pub. No.: WO2015/152857
PCT Pub. Date: Oct. 8, 2015

(65) Prior Publication Data
US 2017/0132144 A1 May 11, 2017

(51) Int. Cl.
*G06F 12/00* (2006.01)
*G06F 12/0893* (2016.01)
*G06F 12/0895* (2016.01)
*G11C 11/406* (2006.01)
*G06F 1/32* (2006.01)
*G06F 12/0802* (2016.01)

(52) U.S. Cl.
CPC ...... *G06F 12/0893* (2013.01); *G06F 12/0895* (2013.01); *G11C 11/40607* (2013.01); *G06F 1/3275* (2013.01); *G06F 1/3287* (2013.01); *G06F 12/0802* (2013.01); *G06F 2212/1028* (2013.01); *G06F 2212/601* (2013.01); *G11C 11/406* (2013.01); *Y02D 10/13* (2018.01)

(58) Field of Classification Search
CPC ......... G06F 12/0893; G06F 2212/1028; G06F 1/3275; G06F 1/3287; G11C 11/40607; G11C 11/406; G11C 11/4061
USPC ............ 711/106, 105, 118; 365/222, 185.25; 714/754
See application file for complete search history.

(56) References Cited

U.S. PATENT DOCUMENTS

| | | | | |
|---|---|---|---|---|
| 4,380,812 A | * | 4/1983 | Ziegler, II | G06F 11/106 714/54 |
| 5,122,988 A | * | 6/1992 | Graeve | G01R 31/31919 365/219 |
| 6,282,147 B1 | | 8/2001 | Fujima | |
| 6,920,523 B2 | | 7/2005 | Le et al. | |
| 6,990,029 B2 | | 1/2006 | Hardee | |

(Continued)

OTHER PUBLICATIONS

Shekhar Borkar et al., "The Future of Microprocessors", Communications of the ACM, May 2011, pp. 67-77, vol. 54, No. 5.

(Continued)

*Primary Examiner* — Hong C Kim

(57) ABSTRACT

Techniques described herein generally include methods and systems related to dynamic cache-sizing used to reduce the energy consumption of a DRAM cache in a chip multiprocessor. Dynamic cache sizing may be performed by adjusting the refresh interval of a DRAM cache or by combining way power-gating of the DRAM cache with adjusting the refresh interval.

19 Claims, 10 Drawing Sheets

| Effective Cache Capacity | Cache Refresh Interval | Way Power-Gating Level | Resultant DRAM Power |
|---|---|---|---|
| 100% | 64 ms | 0 | 100% |
| 99.9% | 512 ms | 0 | 56.3% |
| 93.4% | 1024 ms | 0 | 53.3% |
| 87.9% | 1024 ms | 1 | 49.8% |
| 82.0% | 1024 ms | 2 | 46.5% |
| 76.2% | 1024 ms | 3 | 43.2% |
| 70.3% | 1024 ms | 4 | 40.0% |
| 64.5% | 1024 ms | 5 | 36.5% |
| 58.6% | 1024 ms | 6 | 33.2% |
| 52.8% | 1024 ms | 7 | 30.0% |
| 46.9% | 1024 ms | 8 | 26.6% |
| 41.0% | 1024 ms | 9 | 23.2% |
| 35.2% | 1024 ms | 10 | 20.0% |
| 29.3% | 1024 ms | 11 | 16.6% |
| 23.5% | 1024 ms | 12 | 13.3% |
| 17.6% | 1024 ms | 13 | 9.9% |
| 11.7% | 1024 ms | 14 | 6.6% |
| 5.9% | 1024 ms | 15 | 3.3% |
| 0% | 1024 ms | 16 | 0% |

(56) References Cited

U.S. PATENT DOCUMENTS

| | | |
|---|---|---|
| 7,421,552 B2 | 9/2008 | Long |
| 7,805,658 B2 | 9/2010 | Luk et al. |
| 8,443,230 B1 | 5/2013 | James-Roxby et al. |
| 2004/0062119 A1 | 4/2004 | Stimak et al. |
| 2006/0002220 A1 | 1/2006 | Spengler |
| 2009/0144491 A1* | 6/2009 | Faucher .............. G06F 12/0893 711/106 |
| 2009/0259813 A1 | 10/2009 | Yasufuku |
| 2011/0022801 A1 | 1/2011 | Flynn |
| 2012/0054441 A1 | 3/2012 | Nakashima et al. |
| 2012/0159074 A1* | 6/2012 | Sodhi .................. G06F 12/0895 711/122 |
| 2012/0198163 A1 | 8/2012 | Damodaran et al. |
| 2012/0278548 A1 | 11/2012 | Bronson et al. |
| 2013/0111121 A1 | 5/2013 | Ananthakrishnan et al. |
| 2014/0013132 A1 | 1/2014 | de Rochemont et al. |
| 2014/0032829 A1* | 1/2014 | Solihin ................ G11C 7/1072 711/105 |
| 2015/0243340 A1* | 8/2015 | Solihin ................ G11C 29/023 711/106 |

OTHER PUBLICATIONS

Philip G. Emma et al., "Rethinking Refresh: Increasing Availability and Reducing Power in DRAM for Cache Applications", IEEE Micro, Nov.-Dec. 2008, pp. 47-56, vol. 28, No. 6.

Denis Foley et al., "AMD's "LLANO" Fusion Apu," Hot Chips 23, Aug. 9, 2011, pp. 1-38.

Mrinmoy Ghosh et al., "DRAM Decay: Using Decay Counters to Reduce Energy Consumption in DRAMs", In Proceedings of the 3rd Watson Conference on Interaction between Architecture, Circuits, and Compilers (P=AC2), Oct. 2006, pp. 1-8.

Mrinmoy Ghosh et al., "Smart Refresh: An Enhanced Memory Controller Design for Reducing Energy in Conventional and 3D Die-Stacked DRAMs", In Proceedings of the 40th Annual IEEE/ACM International Symposium on Microarchitecture, Dec. 1-5, 2007, pp. 134-145.

Maziar Goudarzi et al., "A Software Technique to Improve Yield of Processor Chips in Presence of Ultra-Leaky SRAM Cells Caused by Process Variation", Asia and South Pacific Design Automation Conference, Jan. 23-26, 2007, pp. 878-883.

Intel Corporation, "Intel® CoreTM2 Duo Mobile Processor, Intel® CoreTM2 Solo Mobile Processor and Intel® CoreTM2 Extreme Mobile Processor on 45-nm Process," Datasheet, Mar. 2009.

International Search Report and Written Opinion of the International Searching Authority, International application No. PCT/US2014/032285, Aug. 28, 2014.

Kinam Kim et al., "A New Investigation of Data Retention Time in Truly Nanoscaled DRAMs", IEEE Electron Device Letters, Aug. 2009, pp. 846-848, vol. 30, No. 8.

Nam Sung Kim et al., "Circuit and Microarchitectural Techniques for Reducing Cache Leakage Power", IEEE Transactions on Very Large Scale Integration (VLSI) Systems, Sep. 27, 2003, pp. 1-29.

Jamie Liu et al., "RAIDR: Retention-Aware Intelligent DRAM Refresh", Proceedings of the 39th International Symposium on Computer Architecture (ISCA), Jun. 9, 2012, pp. 1-12.

Chris Wilkerson et al., "Reducing Cache Power with Low-Cost, Multi-bit Error-Correcting Codes", Proceedings of the 37th annual international symposium on Computer architecture, Jun. 19-23, 2010, pp. 83-93.

Bo Zhao et al., "Process Variation-Aware Nonuniform Cache Management in a 3D Die-Stacked Multicore Processor", IEEE Transactions on Computers, Nov. 2013, pp. 2252-2265, vol. 62, No. 11.

Bo Zhao et al., "Variation-Tolerant Non-Uniform 3D Cache Management in Die Stacked Multicore Processor", Proceedings of the 42nd Annual IEEE/ACM International Symposium on Microarchitecture, Dec. 12-19, 2009, pp. 222-231.

\* cited by examiner

FIG. 2A

Refresh Interval
64 ms

Effective Capacity
24 blocks = 100%

210

| WAY 1 | WAY2 | WAY 3 | WAY 4 |
|---|---|---|---|
| 1 | 1 | 1 | 1 |
| 1 | 1 | 1 | 1 |
| 1 | 1 | 1 | 1 |
| 1 | 1 | 1 | 1 |
| 1 | 1 | 1 | 1 |
| 1 | 1 | 1 | 1 |

FIG. 2B

Refresh Interval
128 ms

Effective Capacity
23 blocks = 96%

220

| WAY 1 | WAY2 | WAY 3 | WAY 4 |
|---|---|---|---|
| 1 | 1 | 1 | 1 |
| 1 | 1 | 0 | 1 |
| 1 | 1 | 1 | 1 |
| 1 | 1 | 1 | 1 |
| 1 | 1 | 1 | 1 |
| 1 | 1 | 1 | 1 |

FIG. 2C

Refresh Interval
256 ms

Effective Capacity
20 blocks = 80%

230

| WAY 1 | WAY2 | WAY 3 | WAY 4 |
|---|---|---|---|
| 1 | 1 | 1 | 1 |
| 1 | 1 | 0 | 1 |
| 0 | 1 | 1 | 1 |
| 1 | 0 | 1 | 1 |
| 1 | 1 | 1 | 1 |
| 1 | 1 | 1 | 0 |

FIG. 2D

Refresh Interval
512 ms

Effective Capacity
14 blocks = 58%

240

| WAY 1 | WAY2 | WAY 3 | WAY 4 |
|---|---|---|---|
| 1 | 1 | 0 | 1 |
| 1 | 0 | 0 | 1 |
| 0 | 0 | 1 | 0 |
| 1 | 0 | 1 | 1 |
| 0 | 1 | 1 | 1 |
| 0 | 1 | 1 | 0 |

METHODS AND SYSTEMS FOR DYNAMIC DRAM CACHE SIZING

CROSS-REFERENCE TO RELATED APPLICATIONS

The present application is a U.S. National Stage filing under 35 U.S.C. § 371 of International Application No. PCT/US2014/032285, filed on Mar. 29, 2014 and entitled "ENERGY-EFFICIENT DYNAMIC DRAM CACHE SIZING." International Application No. PCT/US2014/032285, including any appendices or attachments thereof, is incorporated by reference herein in its entirety.

BACKGROUND

Unless otherwise indicated herein, the approaches described in this section are not prior art to the claims in this application and are not admitted to be prior art by inclusion in this section.

There is a trend toward large-scale chip multiprocessors that include a relatively large number of processor cores, with core counts as high as hundreds or thousands envisioned in the near future. Such processors can greatly reduce processing time for applications that have high levels of concurrency, e.g., applications in which multiple computations can be executed simultaneously or in parallel with each other. However, as this trend continues, efficient use of all processor cores in high core-count chip multiprocessors may become more difficult, since threshold voltage can no longer be scaled down without exponentially increasing the static power consumption incurred due to leakage current in the chip multiprocessor. As a result, the power budget available per core in high core-count chip multiprocessors may decrease in each future technology generation. This situation may result in a phenomenon referred to as the "power wall," "utility wall," or "dark silicon," where an increasing fraction of a high core-count chip multiprocessor may not be powered at full frequency or powered on at all. Thus, performance improvements in such chip multiprocessors may be strongly contingent on energy efficiency, e.g., performance/watt or operations/joule.

Higher capacity on-chip cache has also been explored as a way to improve chip performance. For example, the last level cache on a multicore die has been implemented in dynamic random access memory (DRAM) rather than static random access memory (SRAM). DRAM may be six to eight times denser than SRAM, and therefore can have significantly greater capacity than a similarly sized SRAM array. This may be particularly advantageous in server chips, in which 50% or more of the die area can be dedicated to on-chip cache. Furthermore, three-dimensional stacking of DRAM chips in a processor chip package may allow one or more separate DRAM dies to be stacked on a logic processor die, thereby facilitating a very large DRAM storage near the processor. Another technology that achieves high capacity for on-chip cache includes MRAM (magneto-resistive RAM). DRAM is a volatile memory, while in some cases MRAM may be designed to be semi-volatile in order to lower write latency and energy.

SUMMARY

In accordance with at least some embodiments of the present disclosure, a method of dynamic cache sizing in a volatile memory device comprises receiving a target storage capacity, selecting a refresh interval for the volatile memory device, and operating the volatile memory device at the selected refresh interval so that the volatile memory device has a modified data storage capacity, the modified data storage capacity being equal to or greater than the received target storage capacity.

In accordance with at least some embodiments of the present disclosure, a method of dynamic cache sizing in a volatile memory device comprises receiving a target storage capacity and determining a first energy saving of the volatile memory device associated with power-gating a portion of the volatile memory device, a remainder portion of the volatile memory device including a data storage capacity that is equal to or greater than the received target storage capacity. The method may further comprise determining a second energy saving of the volatile memory device associated with operating the volatile memory device at a selected refresh interval, the data storage capacity of the volatile memory device in connection with operation at the selected refresh interval being equal to or greater than the received target storage capacity, and based on the first energy saving being greater than the second energy saving, power-gating the portion of the volatile memory device.

In accordance with at least some embodiments of the present disclosure, a processor comprises a processor unit, a volatile memory device that is configured as a cache memory and is coupled to the processor unit, and a cache memory controller. The cache memory controller is coupled to the volatile memory device and is configured to select a refresh interval for the volatile memory device, and operate the volatile memory device at the selected refresh interval so that the volatile memory device has a modified data storage capacity, the modified data storage capacity being equal to or greater than a target storage capacity.

In accordance with at least some embodiments of the present disclosure, a processor comprises a processor unit, a volatile memory device that is configured as a cache memory and is coupled to the processor unit, and a cache memory controller. The cache memory controller is coupled to the volatile memory device and is configured to determine a first energy saving of the volatile memory device associated with power-gate of a portion of the volatile memory device, a remainder portion of the volatile memory device including a data storage capacity that is equal to or greater than a target storage capacity, determine a second energy saving of the volatile memory device associated with operation of the volatile memory device at a selected refresh interval, the data storage capacity of the volatile memory device in connection with the operation at the selected refresh interval being equal to or greater than the target storage capacity, and based on the first energy saving being greater than the second energy saving, power-gate the portion of the volatile memory device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

FIGS. 2A-2D illustrate an embodiment of example valid block subtables included in a valid block table for the computing device illustrated in FIG. 1;

DETAILED DESCRIPTION

Figure 1:
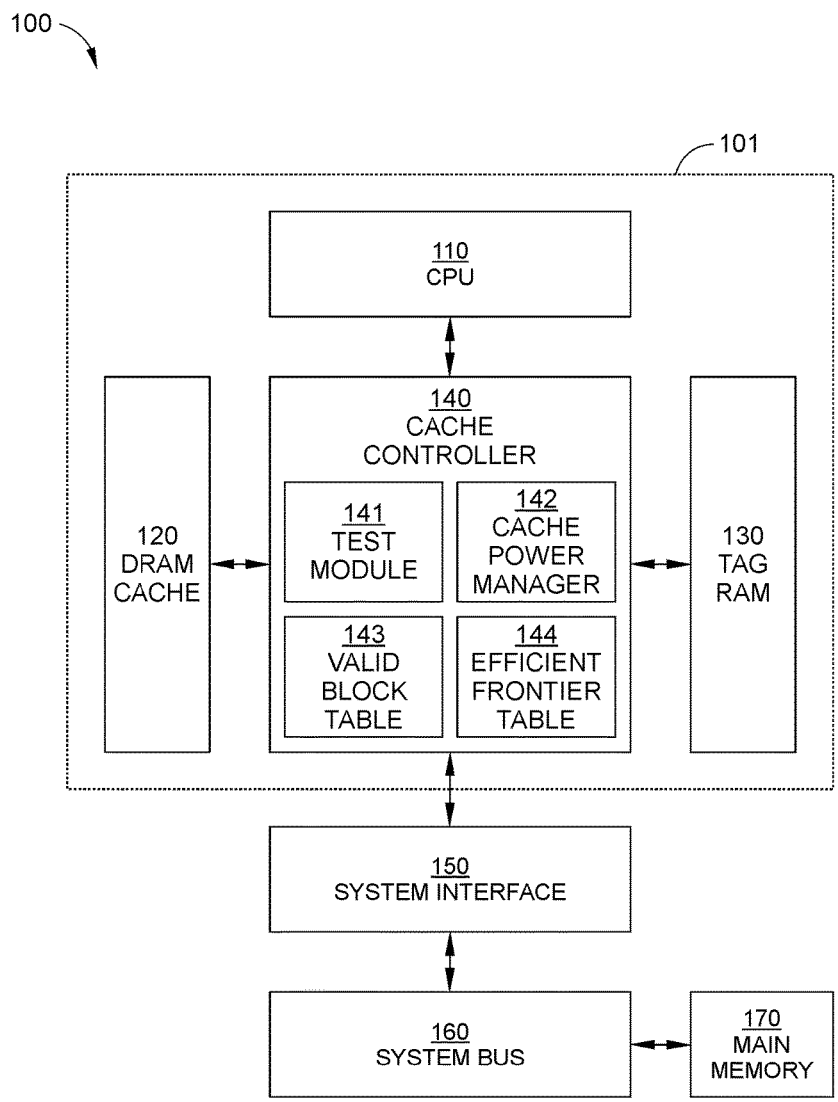
FIG. 1 is a block diagram of an example embodiment of a computing device, arranged in accordance with at least some embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. The aspects of the disclosure, as generally described herein, and illustrated in the Figures, can be arranged, substituted, combined, and designed in a wide variety of different configurations, all of which are explicitly contemplated and make part of this disclosure.

This disclosure is generally drawn, inter alia, to methods, apparatus, systems, devices, and computer program products related to energy-efficient dynamic cache sizing, such as for instance to dynamically size a DRAM cache.

Briefly stated, techniques described herein generally include methods and systems related to dynamic cache-sizing used to reduce the energy consumption of a DRAM cache in a chip multiprocessor. Dynamic cache sizing may be performed by adjusting the refresh interval of a DRAM cache or by combining way power-gating of the DRAM cache with adjusting the refresh interval.

As described above, one technique for enhancing processor performance is to employ a large number of processor cores in a single processor chip, or die. Performance may be further improved by implementing the last level cache on such a chip in high-density dynamic random access memory (DRAM), rather than in static random access memory (SRAM), since larger on-chip cache may generally translate into reduced latency. However, employing large-capacity DRAM as on-chip cache can greatly exacerbate the "power wall" effect in a host chip, so that performance improvements in the host chip associated with much larger cache size may be more than offset by energy budget constraints imposed by the large-capacity DRAM cache. Specifically, the greater energy demands of a large-capacity DRAM cache can significantly reduce the energy budget available for powering some or all of the processor cores.

A significant portion of the energy consumption of a DRAM device may be due to the refresh energy used during operation. Unlike an SRAM cell, a DRAM cell includes a capacitor that is either charged (representing a bit value of "1") or not charged (representing a bit value of "0"). The charge leaks over time, and is refreshed periodically at a particular refresh interval, for example once every 64 ms, by reading out a row of DRAM cells and then restoring each charge in the row DRAM cells. To prevent the loss of data in a particular DRAM row, the refresh interval may be selected to be equal to or less than a "retention time" for the leakiest DRAM cell in the DRAM row, where the retention time is the time period in which the DRAM cell retains sufficient charge without losing data.

In a discrete DRAM device used in main memory, refresh power may make up a relatively small portion of the total power consumed by the DRAM device. For example, in a 2 giga-byte (GB) generation DRAM device, refresh power may be on the order of about 10% of total power consumed. But for future generations of DRAM, the transistor miniaturization used to achieve such memory density may generally also involve an increase in manufacturing variation, due to the increased variability associated with manufacturing such small transistors uniformly. Consequently, refresh interval of the DRAM device is reduced accordingly to accommodate the threshold voltage of the leakiest DRAM cell, greatly increasing how much refresh power is consumed by a DRAM device. For example, it is estimated that refresh power for a 64 GB generation DRAM device may be on the order of 45% or more of the total power consumed by such a device. Furthermore, DRAM implemented as on-chip cache may operate at a higher temperature and hence may be significantly leakier than discrete DRAM devices used for the main memory. Thus, refresh interval of DRAM implemented as on-chip cache may involve an even shorter refresh interval, so that refresh energy may consume a much larger fraction of total power consumption compared to discrete DRAM devices.

In light of the above, a possible avenue in improving energy efficiency in a chip multiprocessor is to reduce the energy consumption associated with a DRAM cache for such a multi-chip processor. According to embodiments of the present disclosure, systems and methods of dynamic cache-sizing may be used to reduce the energy consumption of the DRAM cache in a chip multiprocessor. Specifically, dynamic cache sizing may be performed by adjusting the refresh interval of a DRAM cache or by combining way power-gating with adjusting the refresh interval. Techniques of adjusting the refresh interval and way power-gating are described below in conjunction with FIGS. 5-8.

FIG. 1 is a block diagram of an example computing device 100, arranged in accordance with at least some embodiments of the present disclosure. Computing device 100 may include a single-core or multi-core processor formed on a single processor chip 101, and may be configured to perform dynamic cache sizing according to one or more embodiments of the disclosure. Computing device 100 may include at least one central processing unit (CPU) 110 or other processor unit, a DRAM cache 120, a tag RAM 130, and a cache controller 140, all of which may be formed on processor chip 101. Alternatively, one or more of CPU 110, DRAM cache 120, tag RAM 130 and cache controller 140 may be formed on one or more separate-but-closely-positioned IC chips such as through die stacking. In addition to processor chip 101, computing device 100 may include a system interface 150, a system bus 160, and a main memory 170, all arranged as shown.

It is noted that the embodiment of computing device 100 in FIG. 1 is configured with a look-through cache architecture, in which cache controller 140 is positioned between CPU 110 and system interface 150. In a look-through cache architecture, cache controller 140 sees the processor bus cycle before allowing processor data requests to pass on to system bus 160. In other embodiments, computing device 100 may be configured with a look-aside cache architecture (or any other technically feasible cache architecture).

System interface 150, also referred to as a bus interface unit, may be the interface between CPU 110 and system bus 160. System bus 160 may couple the major various components of computing system 100, and may include a data bus to carry information, an address bus to determine where such data is sent, and a control bus that carries commands from CPU 110 and returns status signals from the various devices of computing system 100. Main memory 170 may include the primary memory of computing device 100 and may be a volatile memory, such as random access memory (RAM).

CPU 110 may be any technically feasible processor or processor core suitable for formation on processor chip 101. Generally, CPU 110 may be configured to process one or multiple applications or execution threads of a software application. When CPU 110 reads data from (and in some cases writes data to) a memory location in main memory 170, DRAM cache 120 (specifically, tag RAM 130, which is described below) may be first checked for a copy of that data. When a copy is determined to be in DRAM cache 120, CPU 110 may immediately read from (or may write to) DRAM cache 120, which is a process that may be much faster than reading from or writing to main memory 170. While the embodiment of computing device 100 illustrated in FIG. 1 includes a single CPU 110, in other embodiments, computing device 100 may include multiple processor cores and/or CPUs 110 that are each coupled to cache controller 140. In such embodiments, some or all of the multiple CPUs 110 may be substantially identical in configuration, and in other embodiments, some or all of the multiple CPUs 110 may include various processor core configurations, such as configurations specialized for particular applications, e.g., graphics processing units, etc. In addition, in some embodiments, some or all of CPUs 110 may include a cache for an instruction buffer and a data buffer, sometimes referred to as "L1 cache," and, in some instances, an additional cache level (referred to as "L2 cache") that may be checked if a cache miss occurs in the L1 cache. In other embodiments, DRAM cache 120 may be the only cache associated with CPU or CPUs 110. In yet other embodiments, DRAM cache 120 may be configured as an L2 cache for one or multiple CPUs 110 of computing device 100. In other embodiments, DRAM cache 120 may be configured as a higher level of cache than an L1 or L2 cache, such as an L3 cache. In such embodiments, DRAM 120 may be shared by multiple CPUs 110 of computing device 100, or alternatively may be dedicated as an L3 cache for a single CPU 110.

DRAM cache 120 may include a cache dedicated to a single CPU 110 of computing device 100 or may be a cache shared by multiple CPUs 110 of computing device 100, and may be configured to reduce the latency associated with read and write operations of CPU 110. Thus, DRAM cache 120 may include one or more DRAM devices or structures that are smaller and faster than main memory 170 and may be configured to store copies of more frequently used data that are generally also stored in main memory 170. Because some, most, or even substantially all of the storage capacity of DRAM cache 120 may be DRAM rather than SRAM, refresh power may make up a significant portion of the total power consumed by DRAM cache 120 in operation. According to embodiments of the disclosure, which are described below, the refresh power of DRAM cache 120 may be minimized or otherwise beneficially reduced depending on the cache capacity currently demanded by CPU 110. In this way, more of the energy budget of computing device 100 may be directed to CPU 110, thereby facilitating higher performance, particularly when computing device 100 may be a chip multiprocessor.

Tag RAM 130 may be configured to store and track the addresses of data that are stored in DRAM cache 120. Thus, when CPU 110 reads from (and in some cases writes to) a memory location in main memory 170, tag RAM 130 may be first checked for the memory location. When the memory location is present as an entry in tag RAM 130, a copy of the data of interest may be present in DRAM cache 120, and therefore main memory 170 may not need to be accessed. Tag RAM 130, also referred to as TRAM, may include a small RAM device for storing the addresses of the data that are stored in the DRAM cache 120. In some embodiments, Tag RAM 130 may include one or more DRAM devices, one or more SRAM devices, or a combination of both.

Cache controller 140 may be configured to control cache operations for computing device 100, including monitoring address lines for accesses to memory locations that are included in DRAM cache 120 ("snooping"), taking information from data lines for updating the cache and for maintaining cache consistency ("snarfing"), updating DRAM cache 120 and tag RAM 130, implementing write policy, determining if a memory request is cacheable, and determining if a request is a cache hit or miss, and/or other operation(s) or combinations thereof. According to some embodiments of the present disclosure, cache controller 140 may also be configured with one or more of a test module 141, a cache power manager 142, a valid block table 143, and an efficient frontier table 144, which in turn may be embodied at least in part in hardware, software or other computer-readable instruction, or a combination thereof.

Test module 141 may include logic circuitry configured to determine entries in valid block table 143 and/or efficient frontier table 144. Generally the process of determining such entries may be performed at some time prior to normal operation of computing device 100, for example as part of the manufacturing and/or testing process. Construction of valid block table 143 is described below in conjunction with FIGS. 2A-D, and construction of efficient frontier table 144 is described below in conjunction with FIGS. 3-8. In some embodiments, test module 141 may be implemented as a sub-unit of logic disposed in one or more of CPUs 110, rather than as part of cache controller 140 as shown in FIG. 1.

Cache power manager 142 may include logic circuitry configured to determine what (if any) dynamic cache sizing should be performed by cache controller 140 for a particular cache capacity currently demanded by CPU 110, and to implement the dynamic cache sizing so determined. For example, cache power manager 142 may determine if the refresh interval of DRAM cache 120 should be adjusted and/or if way power-gating should be implemented in DRAM cache 120 to reduce energy consumption thereof. In some embodiments, cache power manager 142 may make such a determination for a particular cache capacity demanded by CPU 110 by comparing a calculated energy consumption of DRAM cache 120 when way power-gating is implemented to a calculated energy consumption of DRAM 120 when the refresh interval of DRAM 120 is increased. In some embodiments, cache power manager 142 may make such a determination by referring to efficient frontier table 144. Use of efficient frontier table 144 for determining if the refresh interval of DRAM cache 120 should be adjusted and/or if way power-gating should be implemented in DRAM cache 120 is described below in conjunction with FIG. 3. In some embodiments, cache power manager 142 may be implemented as a sub-unit of logic disposed in one or more of CPUs 110, rather than as part of cache controller 140 as shown in FIG. 1.

Valid block table 143 may indicate what memory blocks in DRAM cache 120 retain data for a particular refresh interval. For example, in some embodiments, for each refresh interval for which computing device 100 is configured to operate, valid block table 143 may include a valid block subtable indicating which blocks reliably retain data (e.g., with a "1" value) and which blocks do not reliably retain data (e.g., with a "0" value). One embodiment of such subtables is illustrated in FIGS. 2A-2D.

FIGS. 2A-2D illustrate an embodiment of example valid block subtables 210, 220, 230, and 240, respectively, included in valid block table 143. Each of valid block subtables 210, 220, 230, and 240 may indicate which blocks in DRAM cache 120 do and do not retain data at a different respective refresh interval of DRAM cache 120. In the embodiment illustrated in FIGS. 2A-2D, valid block subtables 210, 220, 230, and 240 may be configured for a DRAM cache 120 that has a 4-way associative cache architecture, and therefore each column of valid block subtables 210, 220, 230, and 240 may represent one "way" of DRAM cache 120. However, valid block subtables 210, 220, 230, and 240 may be employed just as effectively when DRAM cache 120 has any technically feasible cache architecture, such as a fully associative cache, a 2-way associative, an 8-way associative cache, a 16-way associative cache, etc.

FIG. 2A illustrates valid block subtable 210, which indicates which of the blocks in DRAM cache 120 retains data at a refresh interval of, for example, 64 ms. Because in this embodiment DRAM cache 120 is manufactured for normal operation with a refresh interval of 64 ms, all or substantially all of the blocks of DRAM cache 120 may retain data at this refresh interval. Consequently, each entry of valid block subtable 210 is a "1" value, and the effective capacity of DRAM cache 120 is indicated to be 24 blocks (100% of DRAM cache 120).

FIG. 2B illustrates valid block subtable 220, indicating which of the blocks in DRAM cache 120 may retain data at a greater refresh interval than that associated with valid block subtable 210, for example, 128 ms rather than 64 ms. As shown, at a refresh interval of 128 ms, a small number of the blocks of DRAM cache 120, in this case one, has been previously determined to be unable to retain data, so that 23 blocks (96% of DRAM cache 120) retain data. Similarly, FIG. 2C illustrates valid block subtable 230, indicating which of the blocks in DRAM cache 120 may retain data at a refresh interval of 256 ms (20 blocks or 80% of DRAM cache 120), and FIG. 2D illustrates valid block subtable 240, indicating which of the blocks in DRAM cache 120 may retain data at a refresh interval of 512 ms (14 blocks or 58% of DRAM cache 120). At longer refresh intervals, which may reduce the refresh power consumed by DRAM cache 120, fewer blocks can retain data, thereby reducing the effective capacity of DRAM cache 120.

The values entered in valid block subtables 210, 220, 230, and 240 may be determined prior to normal operation of computing device 100, or determined during operation when the operating environment has substantially changed. For example, during a testing portion of the manufacturing process, a refresh interval test may be performed in which bit patterns are written to DRAM cache 120, a particular refresh interval is allowed to elapse, and errors are then detected. Such a test may be carried out by a software application run by CPU 110, by external testing equipment, or by test module 141, and the results of the test may be stored in the appropriate valid block subtable of valid block table 143. Thus, in one example, the results of a 64 ms refresh interval error test may be recorded in valid block subtable 210, the results of a 128 ms refresh interval error test may be recorded in valid block subtable 220, the results of a 256 ms refresh interval error test may be recorded in valid block subtable 230, and the results of a 512 ms refresh interval error test may be recorded in valid block subtable 240. Valid block subtable 210, 220, 230, and 240, may be looked up as a guide to determine cache lines to place newly incoming blocks.

Returning to FIG. 1, efficient frontier table 144 may include various dynamic cache-sizing configurations for DRAM cache 120 and a corresponding effective cache capacity of DRAM cache 120 when increased refresh interval and/or way power-gating level is implemented. For example, in some embodiments, efficient frontier table 144 may be configured as a lookup table that indicates a particular dynamic cache-sizing configuration for a given effective cache capacity. Thus, in such embodiments, given a target minimum (or otherwise reduced) cache capacity demanded by CPU 110, cache controller 140 can select an appropriate refresh interval and/or way power-gating level for DRAM cache 120, so that CPU 110 can operate normally even though DRAM cache 120 consumes less power. One such embodiment of efficient frontier table 144 is illustrated in FIG. 3.

Figure 3:
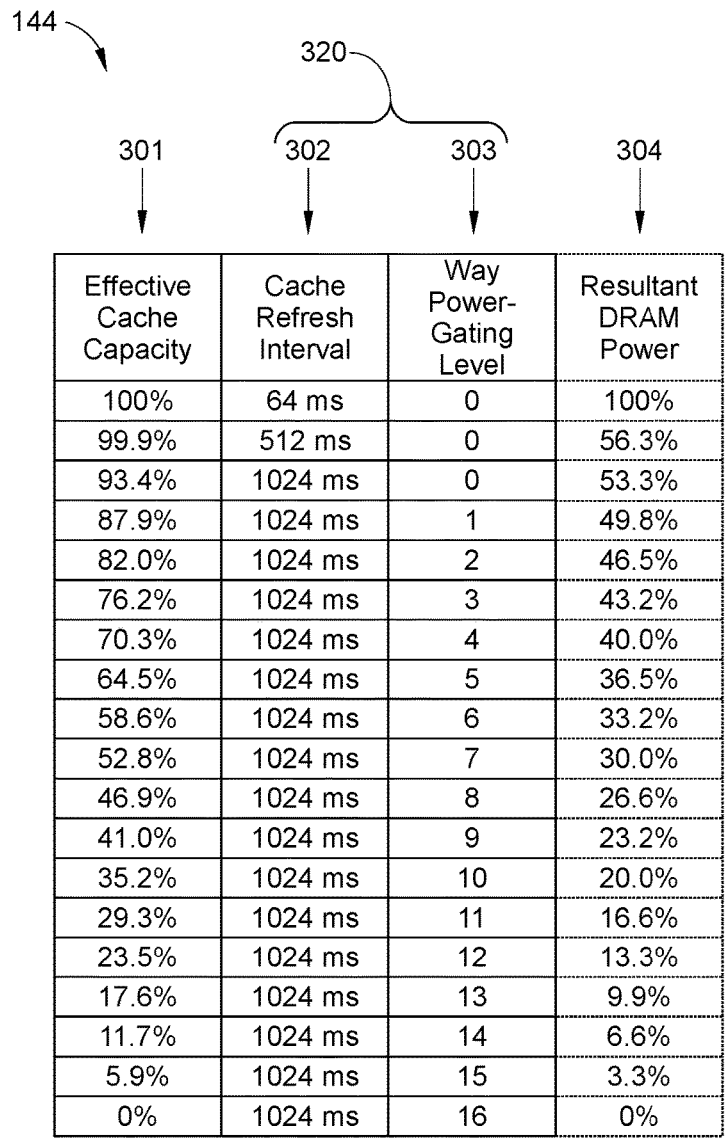
FIG. 3 illustrates an embodiment of an example efficient frontier table for the computing device illustrated in FIG. 1, according to an embodiment of the disclosure.

FIG. 3 illustrates an embodiment of efficient frontier table 144, according to an embodiment of the disclosure. As shown, efficient frontier table 144 may be configured as a lookup table and may include a range of example effective cache capacities 301 of DRAM cache 120, a range of example corresponding cache refresh intervals 302 for DRAM cache 120, and, in some embodiments, a range of example corresponding way power-gating levels 303 for DRAM cache 120. Together, each pair of cache refresh intervals 302 and way power-gating levels 303 may define a particular example cache power configuration 320 of DRAM cache 120, where each particular cache power configuration 320 may provide a unique effective cache capacity 301. For reference, example resultant DRAM power consumption rates 304 are also shown in FIG. 3, one for each cache power configuration 320, but in practice may not necessarily be included in efficient frontier table 144. Resultant DRAM power consumption rates 304 illustrate that as way power-gating level 303 (the number of cache ways power gated in DRAM cache 120) increases, and as cache refresh interval 302 increases, less and less power may be consumed by DRAM cache 120. In addition, effective cache capacity 301 may also decrease. Thus, when CPU 110 operates with less than 100% of cache capacity, cache power manager 142 may select a cache power configuration 320 using efficient frontier table 144, since efficient frontier table 144 may indicate which cache power configuration 320 has a suitable effective cache capacity 301 with the lowest (or otherwise reduced) resultant DRAM power consumption rate 304.

There are numerous situations in which less than 100% cache capacity may be used by CPU 110. For example, in embodiments in which computing device 100 is a mobile device, battery life may be extended by making a cache capacity demanded by CPU 110 in DRAM cache 120 a function of computational load. Thus, when DRAM cache 120 is shared as an L3 or other high-level cache by multiple processor cores, when one or more specialized cores are inactive (such as a core dedicated to web browsing), a corresponding portion of DRAM cache 120 may also be unused, and the effective cache capacity used by CPU or CPUs 110 may be less than 100%.

In the embodiment illustrated in FIG. 3, efficient frontier table 144 provides effective cache capacities 301 and cache power configurations 320 for a DRAM cache 120 that is configured with, for example, 16-way associativity (and therefore includes 16 cache ways that can be independently power gated) and that can operate at refresh intervals of at least 64 ms, 512 ms, and 1024 ms, for example. However, efficient frontier table 144 may be arranged for any other technically feasible configuration of DRAM cache 120 as well. For example, efficient frontier table 144 may include more or fewer cache refresh intervals 302 and/or more or fewer way power-gating levels 303 than are illustrated in FIG. 3.

Various approaches for populating entries of efficient frontier table 144, according to embodiments of the present disclosure, are now described. In some embodiments, efficient frontier table 144 may only include cache refresh intervals 302 and a corresponding effective cache capacity 301 of DRAM cache 120 for each refresh interval 302 represented. Thus, efficient frontier table 144 may not include various way power-gating levels 303 for DRAM cache 120, and dynamic cache-sizing used by cache power manager 142 to reduce energy consumption of DRAM cache 120 may only be based on changing cache refresh interval 302 of DRAM cache 120. In such embodiments, populating the entries of efficient frontier table 144 may be relatively straightforward. For example, as described above in conjunction with FIGS. 2A-2D, during a testing portion of the manufacturing process for processor chip 101, a refresh interval test may be performed by external test equipment or by test module 141, in which bit patterns may be written to DRAM cache 120 and a particular refresh interval may be allowed to elapse. A suitable value of effective cache capacity 301 may be then stored in efficient frontier table 144 for each refresh interval tested based on the number of cache lines of DRAM cache 120 that retain data for the duration of the refresh interval.

In some embodiments, the refresh intervals so tested may vary uniformly, for example the tested refresh intervals may include a base refresh interval at which all or substantially all memory blocks in DRAM cache 120 reliably retain data (e.g., 64 ms) as well as other refresh intervals that are greater than the base refresh interval by a multiple of a particular time interval (e.g., 64 ms, 48 ms, etc.). Thus, in such embodiments, the refresh intervals so tested may be, for example, 64 ms, 128 ms, 192 ms, 256 ms, 320 ms, etc. In other embodiments, the tested refresh intervals may include a base refresh interval at which all or substantially all memory blocks in DRAM cache 120 reliably retain data (e.g., 64 ms), and subsequent refresh intervals to be tested may increase in duration geometrically, so that each refresh interval may be an integer multiple of (for example double) the previous refresh interval (e.g., 128 ms, 256 ms, 512 ms, 1024 ms, etc.). Each of the above-described techniques for selecting refresh intervals to be tested may be computationally efficient. However, any other technique for selecting refresh intervals for DRAM cache 120 may be employed.

Alternatively, in other embodiments, efficient frontier table 144 may include, for each cache power configuration 320 of DRAM cache 120, either a cache refresh interval 302 or a way power-gating level for DRAM cache 120, and a corresponding effective cache capacity of DRAM cache 120. Thus, for a particular target cache capacity, efficient frontier table 144 may indicate which of these two dynamic cache-sizing techniques can be used to reduce energy consumption of DRAM cache 120 while still providing sufficient cache size for CPU 110. An approach for populating entries of efficient frontier table 144, according to such embodiments, is described below in conjunction with FIG. 4.

Figure 4:
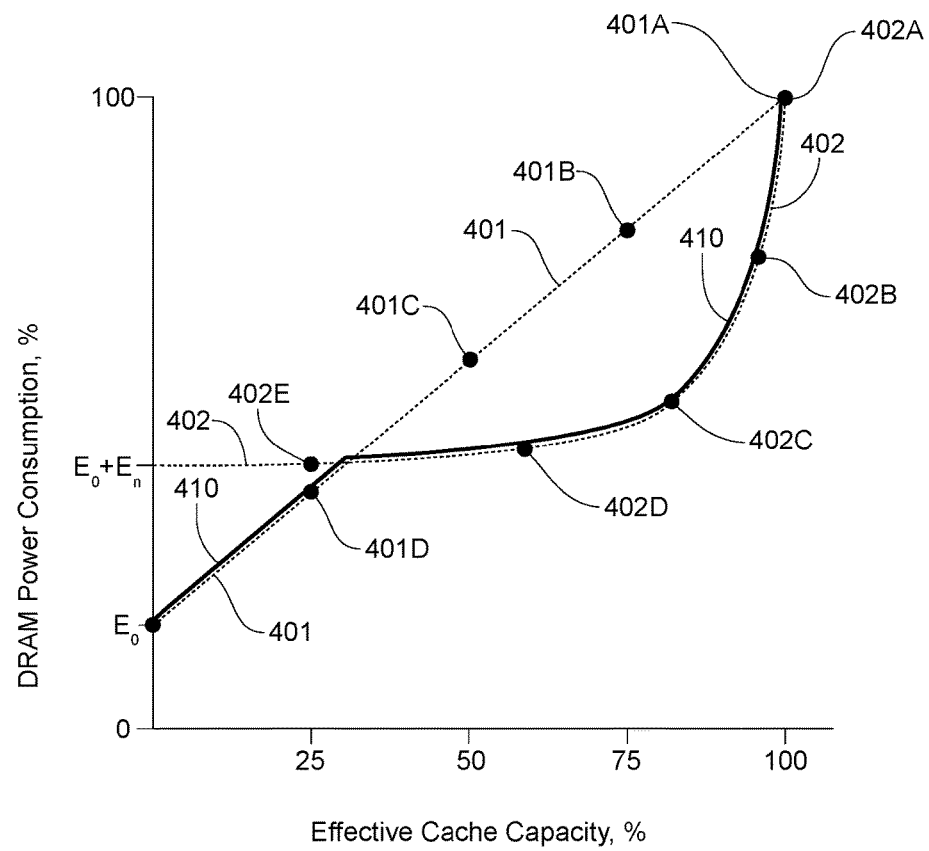
FIG. 4 is a graph illustrating example effective cache capacity vs. resultant DRAM power consumption rate for two dynamic cache-sizing techniques implemented by a cache controller, according to embodiments of the present disclosure.

FIG. 4 is a graph illustrating example effective cache capacity (x-axis) vs. resultant DRAM power consumption rate (y-axis) for two dynamic cache-sizing techniques implemented by cache controller 140, according to embodiments of the present disclosure. Curve 401 represents an example of the dynamic cache-sizing technique of way power-gating, and curve 402 represents an example of the dynamic cache-sizing technique of increased refresh interval. For simplicity of discussion and by way of example, curve 401 and curve 402 are shown for the 4-way associative cache configuration of DRAM cache 120 used to construct valid block subtables 210, 220, 230, and 240 in FIGS. 2A-2D. Thus, curve 401 includes five points 401A-401E, corresponding to the example five possible way power-gating levels of DRAM cache 120 (where either 0, 1, 2, 3, or 4 cache ways are gated, respectively). Similarly, curve 402 includes five points 402A-402E, corresponding to the example five different refresh intervals at which, in this embodiment, DRAM cache 120 is tested (64 ms, 128 ms, 256 ms, 512 ms, and 1024 ms, respectively).

A feature of dynamic cache sizing via increasing refresh interval is the large reduction in refresh energy that may occur when the refresh interval is first increased compared to the normal operating refresh interval of DRAM cache 120. This sharp decrease in refresh energy is illustrated in FIG. 4 between point 402A, which corresponds to a refresh interval of 64 ms, and point 402C, which corresponds to a refresh interval of 256 ms. However, because supporting circuits in DRAM cache 120 may not be turned off as refresh interval is increased, such as decoder and sense amplifiers, there may be a limit to how much energy consumption is reduced, even when refresh interval is extended to a very long duration, such as 1024 ms and longer. Thus, the refresh interval of DRAM cache 120 can have a duration that is long enough that essentially none of the cache lines therein can reliably retain data (0% capacity) and the resultant DRAM power consumption rate may still be significant.

This effect is shown in FIG. 4, where curve 402 becomes largely flat and intersects the y-axis (indicating 0% effective cache capacity) at a value of $E_0+E_n$, where $E_0$=the small amount of energy consumed by DRAM cache 120 even when all cache ways thereof are gated, such as sleep transistor power, and $E_n$=all additional energy consumed by DRAM cache 120 besides refresh energy, such as the energy consumed by sense amps, decoders, tag arrays, and the like. Curve 402, which is a function describing energy consumption for a target cache capacity C as refresh interval is increased, can be described by Equation 1, where EIRI(C) =energy consumed by DRAM cache 120 when an increased refresh interval is used to achieve target cache capacity C, $E_r$=refresh energy consumed by DRAM cache 120, i(C)=the refresh interval required to achieve target cache capacity C, and $i_0$=the initial refresh interval at which DRAM cache 120 has a capacity of substantially 100% (e.g., 64 ms):

$$EIRI(C) = E_0 + E_n + \frac{i_0}{i(C)}E_r \qquad (1)$$

It is noted that the dashed line of curve 402 connecting points 402A-402D indicates values of EIRI(C) for a continuum of possible refresh interval values between the refresh interval values represented by points 402A-402D and that points 402A-402D selected on curve 402 may not be uniformly distributed thereon. It is further noted that initially EIRI(C) may decline very rapidly due to two factors. First, refresh interval may be increased at an exponential rate, e.g., in steps of $i_0*2$, $i_0*4$, $i_0*8$, etc. Hence, the expression $i_0/i(C)$ may decline quickly initially but may flatten as target cache capacity approaches 0%. Second, i(C) may be directly related to the retention time of DRAM cells in DRAM cache 120, e.g., C=Pr[Retention Time>i]. Since retention time distribution of DRAM cells may be lognormal, then i(C) may increase significantly with even a small decrease in C initially, but at some point further, the increase may involve a large decrease in C.

In comparison to performing dynamic cache sizing via increasing refresh interval, as described by Equation 1, power gating cache ways may reduce energy consumption more gradually. Specifically, power gating cache ways may reduce energy consumed by DRAM cache 120 substantially linearly, since most supporting circuits for each cache way may also be turned off. Thus, curve 401, which is a function describing energy consumption for a target cache capacity C as cache ways are power gated, can be described by Equation 2, where EWPG(C)=energy consumed by DRAM cache 120 when way power gating is used to achieve target cache capacity C, where C0=the maximum cache capacity of DRAM cache 120, when all cache ways are in use:

$$EWPG(C) = E_0 + \frac{C}{C_0}(E_r + E_n) \qquad (2)$$

As illustrated by FIG. 4, there are scenarios where increasing refresh intervals may be more attractive than way power gating, and there are scenarios where way power gating may be more attractive than increasing refresh interval. For example, if CPU 110 demands a certain target cache capacity X, cache power manager 142 may compare target cache capacity X to the smallest effective cache capacity 301 in efficient frontier table 144 (illustrated in FIG. 3.) that exceeds X. Thus, in some embodiments, a so-called "efficient frontier" 410 in FIG. 4 (denoted by a solid line) may be used to determine a particular cache power configuration 320 of DRAM cache 120 for each value of effective cache capacity 301 in FIG. 3. Specifically, for a particular target cache capacity 320, one of two techniques of dynamic cache-sizing may be used to configure DRAM cache 120 (either way power-gating or increased refresh interval). The technique selected may be that which enables DRAM cache 120 to operate at the lowest (or otherwise reduced) resultant DRAM power consumption rate with at least the target cache capacity. Stated another way, points of either curve 401 or curve 402 that fall along efficient frontier 410 may be used for the different cache capacities 320 in efficient frontier table 144.

For example, CPU 110 may communicate to cache controller 140 that an effective cache capacity of at least 25% corresponds to proper operation. As shown in FIG. 4, at 25% cache capacity, DRAM cache 120 may use significantly less energy with way power-gating (curve 401) than with reduced refresh interval (curve 402). Consequently, for an effective cache capacity of at least 25%, cache power configuration 320 implemented in DRAM cache 120 may correspond to point 401D, where three of the four cache ways of DRAM cache 120 may be power gated. In another example, CPU 110 may communicate to cache controller 140 that an effective cache capacity of at least 75% corresponds to proper operation. As shown in FIG. 4, at 75% cache capacity, DRAM cache 120 may use significantly less energy with reduced refresh interval (curve 402) than with way power-gating (curve 401). Consequently, for an effective cache capacity of at least 75%, cache power configuration 320 implemented in DRAM cache 120 may correspond to point 402C, where DRAM cache 120 may operate with a refresh interval of 256 ms and no cache ways are power gated. Thus, in such embodiments, the selection of either reduced refresh interval or way power-gating to reduce power consumption by DRAM cache 120 may depend on the specific target cache capacity required by CPU 110.

In some embodiments, a combination of both reduced refresh interval and way power-gating may be used to generate a hybrid efficient frontier that can further reduce the energy consumed by DRAM cache 120 for particular target cache capacities. In such embodiments, both a reduced refresh interval and some level of way power-gating may be used for some target cache capacities, and for other target cache capacities, only a reduced refresh interval may be used. Thus, unlike efficient frontier 410 in FIG. 4, a hybrid efficient frontier may include points representing a combination of both reduced refresh interval and way power-gating rather than only including points representing either reduced refresh interval or way power-gating. An embodiment of one such hybrid efficient frontier is illustrated in FIG. 5.

Figure 5:
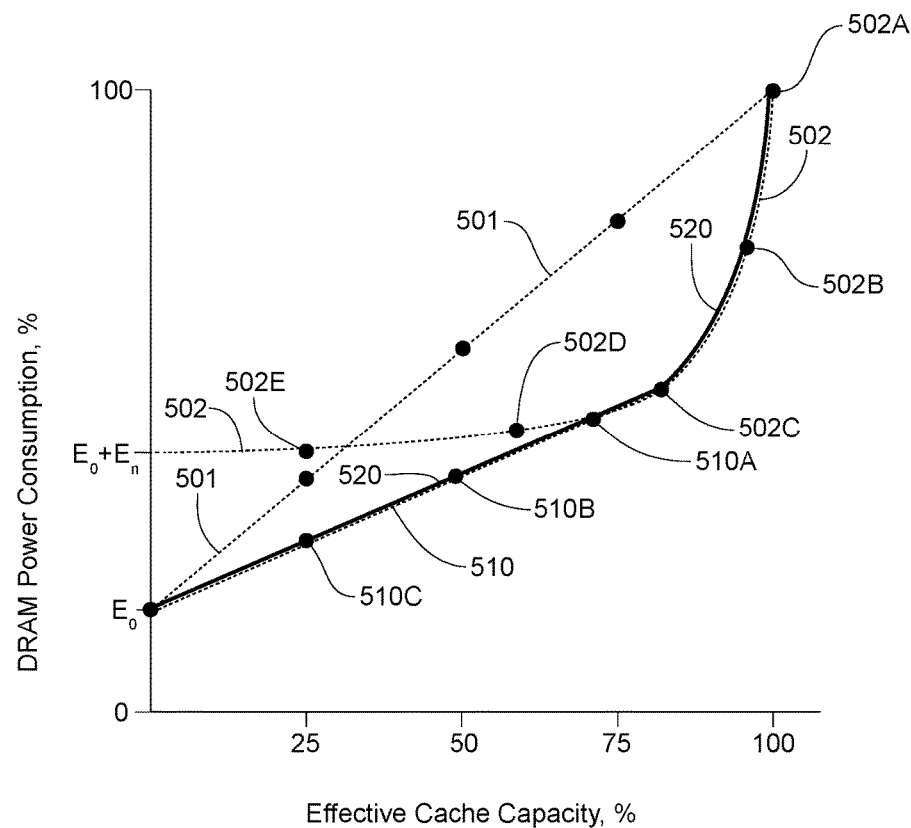
FIG. 5 is a graph illustrating example effective cache capacity vs. resultant DRAM power consumption rate for a hybrid efficient frontier and two dynamic cache-sizing techniques employed by a cache controller, according to embodiments of the present disclosure.

FIG. 5 is a graph illustrating example effective cache capacity (x-axis) vs. resultant DRAM power consumption rate (y-axis) for a hybrid efficient frontier 520 (solid line) and two dynamic cache-sizing techniques employed by cache controller 140, according to embodiments of the present disclosure. Similar to curve 401 in FIG. 4, curve 501 represents an example of the dynamic cache-sizing technique of way power-gating for a 4-way associative cache configuration of DRAM cache 120 and, similar to curve 502 in FIG. 4, curve 502 represents an example of the dynamic cache-sizing technique of increased refresh interval of this configuration of DRAM cache 120, and includes points 502A-502E. As indicated in FIG. 5, hybrid efficient frontier 520 corresponds to portions of curve 502 and curve 510.

Curve 510 represents an example of a portion of hybrid efficient frontier 520 formed by various combinations of way power-gating and increased refresh interval implemented in DRAM cache 120. Thus points 510A, 510B, and 510C each may represent a specific cache power configuration of DRAM cache 120 that includes both a level of way power-gating and an increased refresh interval. For example, point 510A may indicate the resultant DRAM power consumption rate of DRAM cache 120 when configured to operate with one of four cache ways power gated and with an increased refresh interval equal to the refresh interval associated with point 502C; point 510B may indicate the resultant DRAM power consumption rate of DRAM cache 120 when configured to operate with two of four cache ways power gated and with the same refresh interval as that of point 502C; and point 510C may indicate the resultant DRAM power consumption rate of DRAM cache 120 when configured to operate with three of four cache ways power gated and with the same refresh interval as that of point 502C.

As shown in FIG. 5, for cache capacities less than about 80%, which may be the cache capacity associated with point 502C, cache power configurations of DRAM cache 120 that provide the lowest (or otherwise reduced) energy consumption may be those associated with curve 510 of hybrid efficient frontier 520. It is further noted that, compared to only using increased refresh interval (that is, curve 502), for cache capacities less than about 80%, in this particular example, hybrid efficient frontier 520 may provide more cache power configurations. For example, in the embodiment of hybrid efficient frontier 520 illustrated in FIG. 5, DRAM cache 120 may operate with the cache power configurations represented by points 510A, 510B, and 510C. In contrast, curve 502 may only include points 502D and 502E as possible cache power configurations for DRAM cache 120 for cache capacities less than about 80%.

Figure 6:
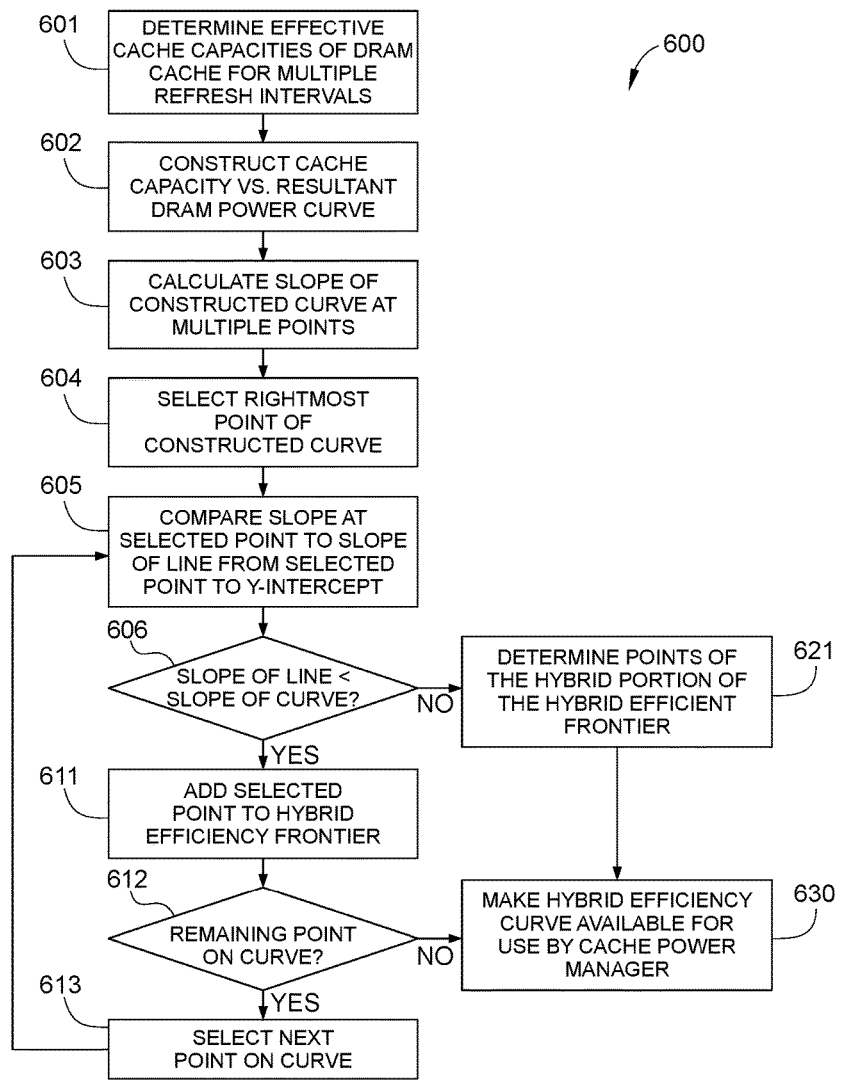
FIG. 6 sets forth a flowchart summarizing an example method to construct a hybrid efficient frontier, according to an embodiment of the disclosure.

FIG. 6 sets forth a flowchart summarizing an example method 600 to construct hybrid efficient frontier 520, according to an embodiment of the disclosure. Method 600 may include one or more operations, functions, or actions as illustrated by one or more of blocks 601-630. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks representing other operations, functions, or actions may be provided. Although method 600 is described in conjunction with computing device 100 of FIG. 1 and hybrid efficient frontier 520 of FIG. 5, any suitable computing device configured to perform method 600 is within the scope of this disclosure.

Method 600 may begin in block 601 ("Determine effective cache capacities of DRAM cache for multiple refresh intervals"), in which test module 141 (or any other suitably configured software, firmware, or logic circuit entity) may receive or otherwise determine effective cache capacities of DRAM cache 120 for multiple refresh intervals of various durations. For example, in some embodiments, test module 141 may perform refresh interval tests on DRAM cache 120 prior to normal operation of computing device 100, such as part of a testing or fabrication process. The refresh intervals so tested may vary uniformly, for example the refresh intervals tested may include a base refresh interval and additional refresh intervals that are greater than the base refresh interval by a multiple of the base refresh interval or of a particular time interval (e.g., 64 ms, 128 ms, 192 ms, 256 ms, 320 ms, etc.). In some embodiments, the additional refresh intervals may increase in duration geometrically, so that each of the additional refresh intervals is an integer multiple of the previous refresh interval (e.g., 128 ms, 256 ms, 512 ms, 1024 ms, etc.). In some embodiments, the additional refresh intervals tested may be selected to be near the "elbow" of curve 402 in FIG. 5, to more accurately determine at what refresh interval the cache capacity of DRAM cache 120 begins to decrease quickly. The results of such testing may be used to populate valid block table 143 in cache controller 140.

In block 602 ("Construct cache capacity vs. resultant DRAM power curve"), test module 141, cache power manager 142, or any other suitably configured software, firmware, or logic circuit entity associated with cache controller 140 may construct a cache capacity vs. resultant dram power consumption rate curve (e.g., curve 402 in FIG. 5), using the effective cache capacities determined in block 601.

In block 603 ("Calculate slope of constructed curve at multiple points"), test module 141, cache power manager 142, or any other suitably configured software, firmware, or logic circuit entity associated with cache controller 140 may calculate slopes along curve 402 using any suitable numerical method.

In block 604 ("Select rightmost point of constructed curve"), test module 141, cache power manager 142, or any other suitably configured software, firmware, or logic circuit entity associated with cache controller 140 may determine points of hybrid efficient frontier 520. For example, in one embodiment, such a procedure may begin at the rightmost point of curve 402, which may represent the highest energy consumption and highest cache capacity of DRAM cache 120.

In block 605 ("Compare slope at selected point to slope of line from selected point to y-intercept"), cache controller 140 may compare the slope of curve 402 at the point selected (either in block 604 or in block 613) to the slope of an imaginary line obtained by connecting the selected point to the y-intercept (i.e., $E_0$).

In block 606 ("Slope of line<slope of curve?"), cache controller 140 may make a determination whether the slope of the imaginary line defined in block 605 is less than the slope of curve 402 at this rightmost point that was selected in block 604. If yes (the slope of the imaginary line defined in block 605 is less than or equal to the slope of curve 402 at the point selected in block 604), then method 600 may proceed to block 611. If no (the slope of the imaginary line defined in block 605 is greater than than the slope of curve 402 at the point selected in block 604), then method 600 may proceed to block 621.

In block 611 ("Add selected point to hybrid efficiency frontier"), cache controller 140 may assume that the point of curve 402 selected in block 604 may be considered part of hybrid efficient frontier 520, and information associated with this point (effective cache capacity 301, cache refresh interval 302, resultant dram power consumption rates 304, etc.) may be added to efficient frontier table 144.

In block 612 ("Remaining point on curve?"), cache controller 140 may make a determination whether there is a remaining point on curve 402 left of the point added to efficient frontier table 144 in block 611. If yes, then method 600 may proceed to block 613. If no, then method 600 may proceed to block 630.

In block 613 ("Select next point on curve"), cache controller 140 may select the next point of curve 402 to the left of the point added to efficient frontier table 144 in block 611, and method 600 may proceed back to block 605.

In block 621 ("Determine points of the hybrid portion of the hybrid efficient frontier"), cache controller 140 may determine points making up portion 510 of hybrid efficient frontier 520. For example, in some embodiments, cache controller 140 may determine points along a line in FIG. 5 from the last point added to efficient frontier table 144 to the y-intercept (i.e., $E_0$). In some embodiments, these added points may correspond to DRAM cache 120 when operating both with a particular level of way power-gating and at the refresh interval of the last point added to efficient frontier table 144. In this way, portion 510 may be determined so that, for effective cache capacities less than that associated with the last point added to efficient frontier table 144 in block 613, significantly less energy may be consumed by DRAM cache 120 than if only way power-gating or increased refresh interval is employed thereby.

In block 630 ("Make hybrid efficiency curve available for use by cache power manager"), method 600 may terminate, and efficient frontier table 144 may be made available for use by cache power manager 142 during operation of computing device 100.

Figure 7:
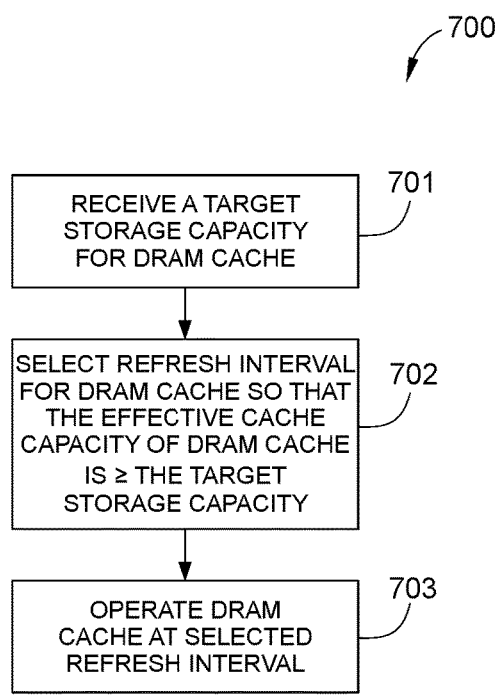
FIG. 7 sets forth a flowchart summarizing an example method to dynamically cache size in a volatile memory device, such as a DRAM cache, according to an embodiment of the disclosure.

FIG. 7 sets forth a flowchart summarizing an example method 700 to dynamic cache size in a volatile memory device, such as DRAM cache 120, according to an embodiment of the disclosure. Method 700 may include one or more operations, functions, or actions as illustrated by one or more of blocks 701-703. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks representing other operations, functions, or actions may be provided. Although method 700 is described in conjunction with computing device 100 of FIG. 1, any suitable computing device configured to perform method 700 is within the scope of this disclosure.

Method 700 may begin in block 701 ("Receive a target storage capacity for DRAM cache"), in which cache controller 140 may receive a target storage capacity for a volatile memory device associated with computing device 100, such as DRAM cache 120. For example, in block 701, cache controller 140 may receive a target storage capacity from CPU 110 of computing device 100.

In block 702 ("Select refresh interval for DRAM cache so that the effective cache capacity of DRAM cache is ≥ the target storage capacity"), cache controller 140 may select a refresh interval for dram cache 120, so that the effective cache capacity of dram cache 120 is equal to or greater than the target storage capacity. In some embodiments, cache controller 140 may select the refresh interval for DRAM cache 120 from valid block table 143 or from efficient frontier table 144, based on effective cache capacity entries therein. Thus, in such embodiments, the refresh interval selected may be a previously tested refresh interval based on a measured data storage capacity of DRAM cache 120. The measured data storage capacity may be measured prior to normal operation of computing device 100 while DRAM cache 120 operates at the previously tested refresh interval.

In block 703 ("Operate DRAM cache at selected refresh interval"), cache controller 140 may operate dram cache 120 at the refresh interval selected in block 702, so that dram cache 120 has a modified data storage capacity, the modified data storage capacity being equal to or greater than the target cache capacity. In such embodiments, the modified data storage capacity may be determined for the refresh interval prior to receiving the target storage capacity, such as during a testing process prior to normal operation of computing device 100. For example, the modified data storage capacity of DRAM cache 120 may be included as an entry in either valid block table 143 or efficient frontier table 144.

In some embodiments, in block 703, cache controller 140 may also power gate a portion of DRAM cache 120 in conjunction with operating DRAM cache 120 at the selected refresh interval selected in block 702. For example, when cache controller 140 uses efficient frontier table 144 to select the refresh interval for DRAM cache 120, a level of power-gating may be associated in efficient frontier table 144 with the selected refresh interval selected in block 702. Thus, the modified data storage capacity of DRAM cached 120 may be a result of power-gating a portion of DRAM cache 120 in conjunction with operating DRAM cache 120 at the selected refresh interval.

In such embodiments, cache controller 140 may first check that power-gating a portion of DRAM cache 120 may be more efficient than only increasing refresh interval of DRAM cache 120. For example, cache controller 140 may, prior to power-gating a portion of DRAM cache 120: i) determine a first energy saving of DRAM cache 120 associated with power gating the portion of the volatile memory device in conjunction with operating DRAM cache 120 at the selected refresh interval; ii) determine a second energy saving of DRAM cache 120 associated with operating DRAM cache 120 at the selected refresh interval; and iii) determine that the first energy saving is greater than the second energy saving.

Figure 8:
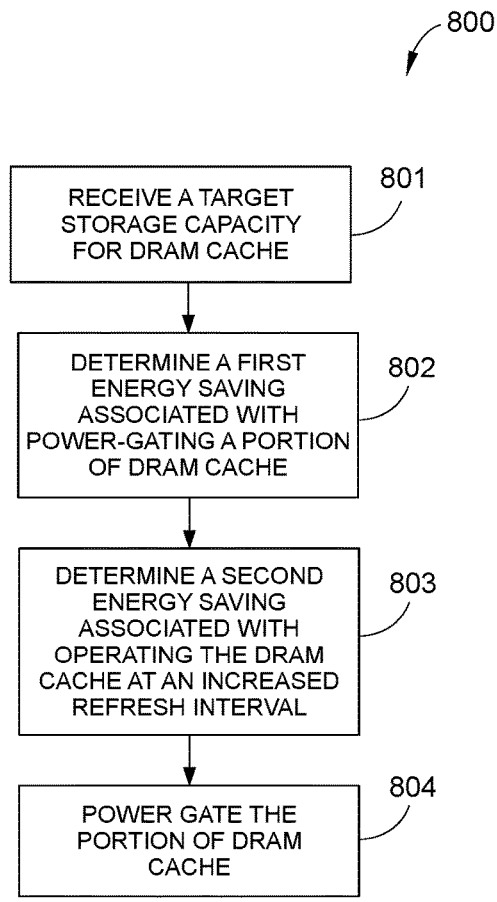
FIG. 8 sets forth a flowchart summarizing an example method to dynamically cache size in a volatile memory device, such as DRAM cache, according to an embodiment of the disclosure.

FIG. 8 sets forth a flowchart summarizing an example method 800 to dynamically cache size in a volatile memory device, such as DRAM cache 120, according to an embodiment of the disclosure. Method 800 may include one or more operations, functions, or actions as illustrated by one or more of blocks 801-804. Although the blocks are illustrated in a sequential order, these blocks may also be performed in parallel, and/or in a different order than those described herein. Also, the various blocks may be combined into fewer blocks, divided into additional blocks, and/or eliminated based upon the particular implementation. Additional blocks representing other operations, functions, or actions may be provided. Although method 800 is described in conjunction with computing device 100 of FIG. 1, any suitable computing device configured to perform method 800 is within the scope of this disclosure.

Method 800 may begin in block 801 ("Receive a target storage capacity for DRAM cache"), in which cache controller 140 may receive a target storage capacity for a volatile memory device associated with computing device 100, such as DRAM cache 120. For example, in block 801, cache controller 140 may receive a target storage capacity from CPU 110 of computing device 100.

In block 802 ("Determine a first energy saving associated with power-gating a portion of DRAM cache"), cache controller 140 may determine a first energy saving amount of dram cache 120 associated with power-gating a portion of dram cache 120, where a remainder portion of dram cache 120 that is not power-gated may have a data storage capacity that is equal to or greater than the target cache capacity.

In block 803 ("Determine a second energy saving associated with operating the DRAM cache at an increased refresh interval"), cache controller 140 may determine a second energy saving of DRAM cache 120 associated with operating DRAM cache 120 at a selected refresh interval. The refresh interval may be selected so that when DRAM cache 120 is operated at the selected refresh interval, the data storage capacity of the volatile memory device may be equal to or greater than the target cache capacity.

In block 804 ("Power gate the portion of DRAM cache"), when cache controller 140 determines that the first energy saving is more than the second energy saving, cache controller 140 may power-gate the portion of the dram cache 120, where the remainder portion of dram cache 120 that is not power-gated has a data storage capacity that may be equal to or greater than the target cache capacity.

Figure 9:
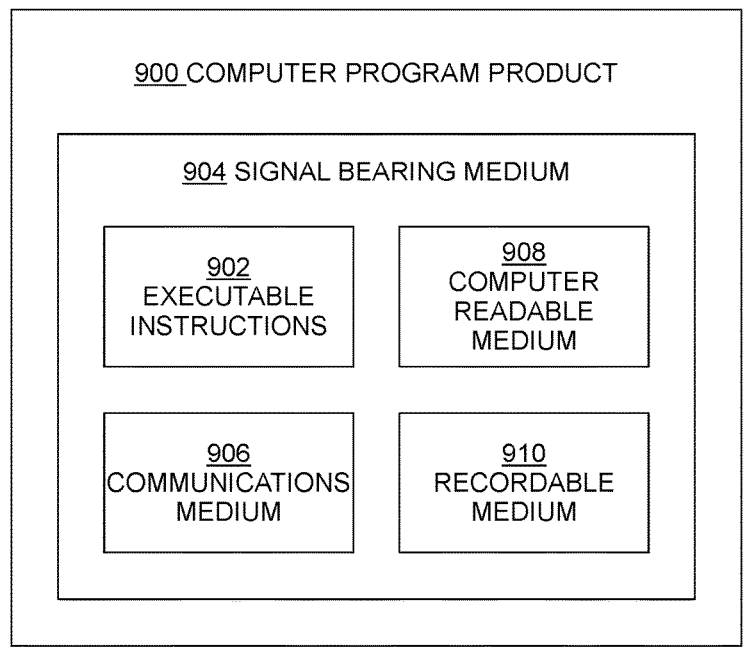
FIG. 9 is a block diagram of an illustrative embodiment of a computer program product to implement a method to dynamically cache size in a volatile memory device of a computing device.

FIG. 9 is a block diagram of an illustrative embodiment of a computer program product 900 to implement a method to dynamic cache sizing in a volatile memory device of a computing device. Computer program product 900 may include a signal bearing medium 904. Signal bearing medium 904 may include one or more sets of executable instructions 902 that, in response to execution by, for example, a processor of a computing device, may provide at least the functionality or features described above with respect to FIGS. 1-8.

In some implementations, signal bearing medium 904 may encompass a non-transitory computer readable medium 908, such as, but not limited to, a hard disk drive, a Compact Disc (CD), a Digital Video Disk (DVD), a digital tape, memory, etc. In some implementations, signal bearing medium 904 may encompass a recordable medium 910, such as, but not limited to, memory, read/write (R/W) CDs, R/W DVDs, etc. In some implementations, signal bearing medium 904 may encompass a communications medium 906, such as, but not limited to, a digital and/or an analog communication medium (e.g., a fiber optic cable, a waveguide, a wired communications link, a wireless communication link, etc.). Computer program product 900 may be recorded on non-transitory computer readable medium 908 or another similar recordable medium 910.

Figure 10:
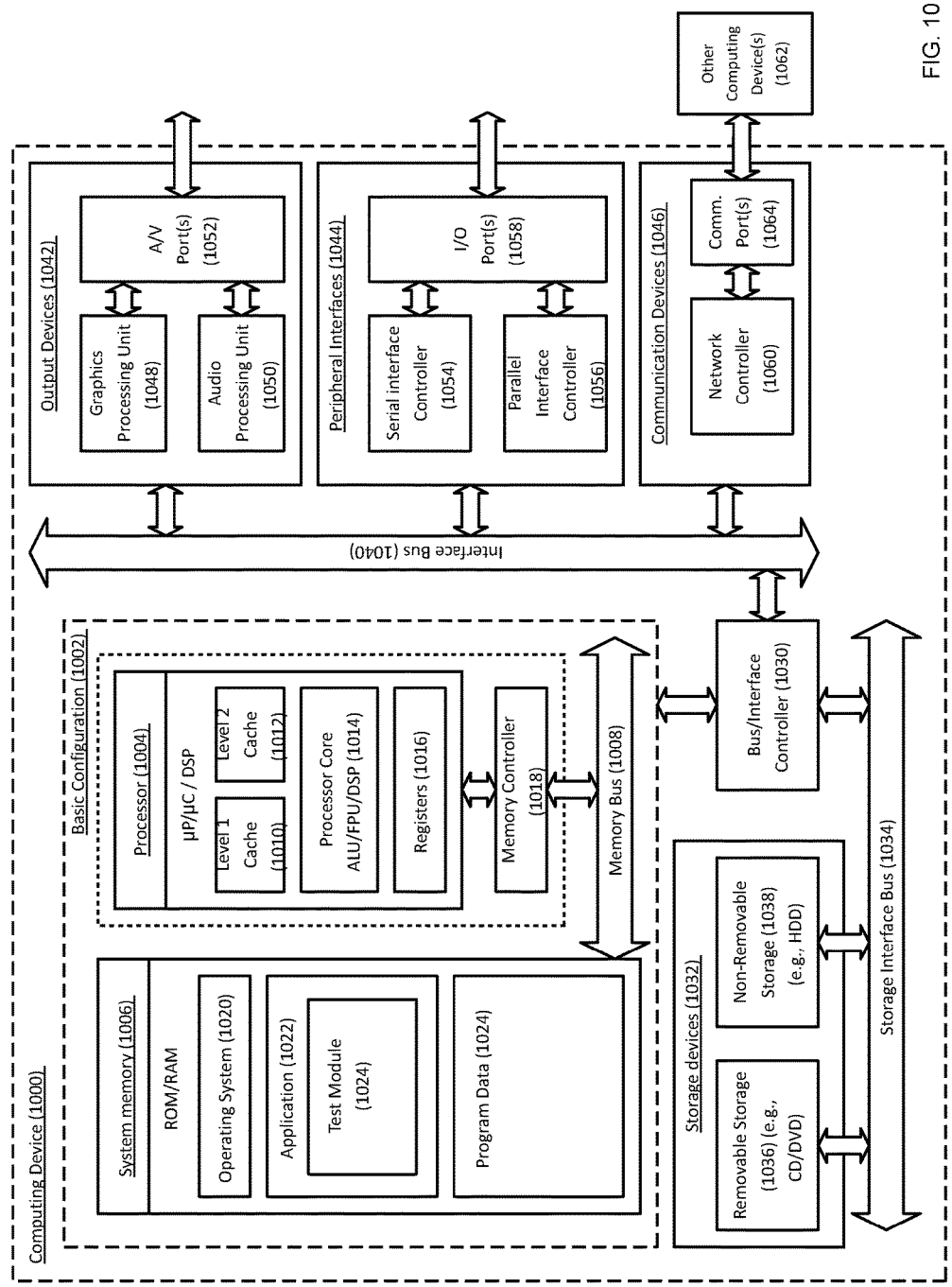
FIG. 10 is a block diagram illustrating an example computing device, all arranged in accordance with at least some embodiments of the present disclosure.

FIG. 10 is a block diagram illustrating an example computing device 1000, according to at least some embodiments of the present disclosure. In some embodiments, computing device 1000 may be used to implement computing device 100 of FIG. 1. In a very basic configuration 1002, computing device 1000 typically includes one or more chip multiprocessors 1004 and a system memory 1006. A memory bus 1008 may be used for communicating between processor 1004 and system memory 1006.

Chip multiprocessor 1004 may be substantially similar in configuration and operation to CPU 110 in FIG. 1. Depending on the desired configuration, chip multiprocessor 1004 may be of any type including but not limited to a microprocessor (μP), a microcontroller (μC), a digital signal processor (DSP), or any combination thereof. Processor 1004 may include one more levels of caching, such as a level one cache 1010 and a level two cache 1012, a processor core 1014, and registers 1016. An example processor core 1014 may include an arithmetic logic unit (ALU), a floating point unit (FPU), a digital signal processing core (DSP Core), or any combination thereof. An example memory controller 1018 may also be used with processor 1004, or in some implementations memory controller 1018 may be an internal part of processor 1004. In one embodiment, memory controller 1018 may be used to implement cache controller 140 of FIG. 1.

Depending on the desired configuration, system memory 1006 (which may be used to implement main memory 170 of FIG. 1) may be of any type including but not limited to volatile memory (such as RAM), non-volatile memory (such as ROM, flash memory, etc.) or any combination thereof. System memory 1006 may include an operating system 1020, one or more applications 1022, and program data 1024. Application 1022 may include a test module 1026, similar to test module 141 of FIG. 1, arranged to perform at least the functions and operations as those described with respect test module 141. Program data 1024 may be useful for operation with test module 1026 as is described herein. In some embodiments, application 1022 may be arranged to operate with program data 1024 on operating system 1020. This described basic configuration 1002 is illustrated in FIG. 10 by those components within the inner dashed line.

Computing device 1000 may have additional features or functionality, and additional interfaces to facilitate communications between basic configuration 1002 and any required devices and interfaces. For example, a bus/interface controller 1030 may be used to facilitate communications between basic configuration 1002 and one or more data storage devices 1032 via a storage interface bus 1034. Data storage devices 1032 may be removable storage devices 1036, non-removable storage devices 1038, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 1006, removable storage devices 1036 and non-removable storage devices 1038 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 1000. Any such computer storage media may be part of computing device 1000.

Computing device 1000 may also include an interface bus 1040 for facilitating communication from various interface devices (e.g., output devices 1042, peripheral interfaces 1044, and communication devices 1046) to basic configuration 1002 via bus/interface controller 1030. Example output devices 1042 include a graphics processing unit 1048 and an audio processing unit 1050, which may be configured to communicate to various external devices such as a display or speakers via one or more A/V ports 1052. Example peripheral interfaces 1044 include a serial interface controller 1054 or a parallel interface controller 1056, which may be configured to communicate with external devices such as input devices (e.g., keyboard, mouse, pen, voice input device, touch input device, etc.) or other peripheral devices (e.g., printer, scanner, etc.) via one or more I/O ports 1058. An example communication device 1046 includes a network controller 1060, which may be arranged to facilitate communications with one or more other computing devices 1062 over a network communication link, such as, without limitation, optical fiber, Long Term Evolution (LTE), 3G, WiMax, via one or more communication ports 1064.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 1000 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1000 may also be implemented as a personal computer including both laptop computer and non-laptop computer configurations.

As described herein, embodiments of the present disclosure enable dynamic cache sizing in a volatile memory device of a computing device, such as a DRAM cache. Dynamic cache sizing may be performed by adjusting the refresh interval of a DRAM cache or by combining adjusting the refresh interval of the cache with way power-gating of one or more ways of the cache. In some embodiments, a valid block table and/or an efficient frontier table may be constructed to facilitate such dynamic cache sizing. Entries in the valid block table indicate which blocks reliably retain data at each of various refresh intervals, and entries in the efficient frontier table indicate what cache power configuration of the DRAM cache is the most energy efficient for a target cache capacity. In some embodiments, the most energy efficient cache power configuration may include a combination of increased refresh interval and way power-gating.

The use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and designing the circuitry and/or writing the code for the software and or firmware are possible in light of this disclosure. In addition, the mechanisms of the subject matter described herein are capable of being distributed as a program product in a variety of forms, and an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. A typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. Such depicted architectures are merely exemplary, and in fact, many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments are possible. The various aspects and embodiments disclosed herein are for purposes of illustration and are not intended to be limiting, with the true scope and spirit being indicated by the following claims.

I claim:

1. A method of dynamic cache sizing in a volatile memory device, the method comprising:
   measuring and recording a respective data storage capacity of the volatile memory device for each refresh interval of multiple refresh intervals;
   receiving a target storage capacity;
   selecting a refresh interval, of the multiple refresh intervals, for the volatile memory device so that the volatile memory device has a modified data storage capacity greater than or equal to the received target storage capacity, wherein each refresh interval of the multiple refresh intervals corresponds to a period of time within which rows of cells in the volatile memory device are read out and recharged; and
   operating the volatile memory device at the selected refresh interval.

2. The method of claim 1, further comprising determining the modified data storage capacity for the refresh interval prior to receiving the target storage capacity.

3. The method of claim 1, wherein selecting the refresh interval for the volatile memory device comprises selecting a previously tested refresh interval based on a measured data storage capacity of the volatile memory device, wherein the data storage capacity is measured with the volatile memory device operating at the previously tested refresh interval.

4. The method of claim 1, further comprising power-gating a portion of the volatile memory device in conjunction while operating the volatile memory device at the selected refresh interval.

5. The method of claim 4, further comprising, prior to power-gating the portion of the volatile memory device:
   determining a first energy saving of the volatile memory device associated with power-gating the portion of the volatile memory device in conjunction with operating the volatile memory device at the selected refresh interval;
   determining a second energy saving of the volatile memory device associated with operating the volatile memory device at the selected refresh interval; and
   determining that the first energy saving is greater than the second energy saving.

6. The method of claim 4, further comprising, prior to power-gating the portion of the volatile memory device, determining a size of the portion based on the received target storage capacity.

7. The method of claim 4, wherein the modified data storage capacity is a result of power-gating the portion of the volatile memory device in conjunction with operating the volatile memory device at the selected refresh interval.

8. A method of dynamic cache sizing in a volatile memory device, the method comprising:
   measuring and recording a respective data storage capacity of the volatile memory device for each refresh interval of multiple refresh intervals;
   receiving a target storage capacity;
   determining a first energy saving of the volatile memory device associated with power-gating a portion of the volatile memory device, wherein the volatile memory device has a remainder portion with a data storage capacity that is equal to or greater than the received target storage capacity;
   determining a second energy saving of the volatile memory device associated with operating the volatile memory device at a selected refresh interval of the multiple refresh intervals, wherein the data storage capacity of the volatile memory device in connection with the operation at the selected refresh interval is equal to or greater than the received target storage capacity;

comparing the first energy saving to the second energy saving; and in response to the first energy saving being greater than the second energy saving, power-gating the portion of the volatile memory device.

9. The method of claim 8, further comprising determining the data storage capacity of the volatile memory device in connection with the operation at the selected refresh interval prior to receiving the target storage capacity.

10. The method of claim 8, further comprising in response to the second energy saving being greater than the first energy saving, operating the volatile memory device at the selected refresh interval.

11. A processor, comprising:
a processor unit;
a volatile memory device that is configured as a cache memory and is coupled to the processor unit; and
a cache memory controller coupled to the volatile memory device and configured to:
measure and record a respective data storage capacity of the volatile memory device for each refresh interval of multiple refresh intervals;
receive a target storage capacity;
select a refresh interval, of the multiple refresh intervals, for the volatile memory device so that the volatile memory device has a modified data storage capacity greater than or equal to the received target storage capacity, wherein each refresh interval of the multiple refresh intervals corresponds to a period of time within which rows of cells in the volatile memory device are read out and recharged; and
operate the volatile memory device at the selected refresh interval.

12. The processor of claim 11, wherein the modified data storage capacity is determined for the refresh interval prior to the receipt of the target storage capacity by the cache memory controller.

13. The processor of claim 11, wherein the cache memory controller is configured to select the refresh interval for the volatile memory device by selection of a previously tested refresh interval based on a measured data storage capacity of the volatile memory device, wherein the measured data storage capacity is measured with the volatile memory device operative at the previously tested refresh interval.

14. The processor of claim 11, wherein the cache memory controller is further configured to power-gate a portion of the volatile memory device in conjunction with the operation of the volatile memory device at the selected refresh interval.

15. The processor of claim 14, wherein the cache memory controller is further configured to:
prior to the power-gate of the portion of the volatile memory device:
determine a first energy saving of the volatile memory device associated with the power-gate of the portion of the volatile memory device in conjunction with the operation of the volatile memory device at the selected refresh interval;
determine a second energy saving of the volatile memory device associated with the operation of the volatile memory device at the selected refresh interval; and
determine that the first energy saving is greater than the second energy saving.

16. The processor of claim 14, wherein the cache memory controller is further configured to, prior to the power-gate of the portion of the volatile memory device, determine a size of the portion based on the received target storage capacity.

17. The processor of claim 14, wherein the modified data storage capacity is a result of the power-gate of the portion of the volatile memory device in conjunction with the operation of the volatile memory device at the selected refresh interval.

18. A processor, comprising:
a processor unit;
a volatile memory device that is configured as a cache memory and is coupled to the processor unit; and
a cache memory controller coupled to the volatile memory device and configured to:
measure and record a respective data storage capacity of the volatile memory device for each refresh interval of multiple refresh intervals;
receive a target storage capacity;
determine a first energy saving of the volatile memory device associated with power-gate of a portion of the volatile memory device, wherein the volatile memory device has a remainder portion with a data storage capacity that is equal to or greater than the received target storage capacity;
determine a second energy saving of the volatile memory device associated with operation of the volatile memory device at a selected refresh interval, wherein the data storage capacity of the volatile memory device in connection with the operation at the selected refresh interval is equal to or greater than the received target storage capacity;
compare the first energy saving to the second energy saving; and
in response to the first energy saving being greater than the second energy saving, power-gate the portion of the volatile memory device.

19. The processor of claim 18, wherein the data storage capacity of the volatile memory device in connection with the operation at the selected refresh interval is measured prior to the receipt of the target storage capacity by the cache memory controller.

* * * * *